United States Patent [19]

Iwanami

[11] 4,278,899
[45] Jul. 14, 1981

[54] ELECTRONIC CIRCUIT FOR A TIMEPIECE

[75] Inventor: Eiichi Iwanami, Tokyo, Japan

[73] Assignee: Kabushiki Kaisha Daini Seikosha, Tokyo, Japan

[21] Appl. No.: 959,455

[22] Filed: Nov. 13, 1978

[30] Foreign Application Priority Data

Nov. 16, 1977 [JP] Japan ................................. 52/137569

[51] Int. Cl.³ ..................... H03K 3/353; H01L 29/06; H01L 29/80
[52] U.S. Cl. .................................. 307/304; 307/303; 357/22
[58] Field of Search ................. 307/304, 303; 357/22, 357/23; 58/23 A, 23 AC, 23 D; 307/220 C, 225 C

[56] References Cited

U.S. PATENT DOCUMENTS

| 3,398,337 | 8/1968 | So .......................................... 357/22 |
| 3,508,084 | 4/1970 | Warner, Jr. ........................ 357/13 X |
| 3,783,349 | 1/1974 | Beasom ................................. 357/22 |
| 4,169,269 | 9/1979 | Aoki et al. ............................ 357/22 |

*Primary Examiner*—John Zazworsky
*Attorney, Agent, or Firm*—Robert E. Burns; Emmanuel J. Lobato; Bruce L. Adams

[57] ABSTRACT

In an electronic circuit for a timepiece comprised of a junction field effect transistor oscillating circuit and a junction field effect transistor frequency dividing circuit, a gate space of the junction field effect transistor used in the oscillating circuit for amplification is formed so as to be longer than that of the junction field effect transistor used in the frequency dividing circuit.

2 Claims, 8 Drawing Figures

ELECTRONIC CIRCUIT FOR A TIMEPIECE

BACKGROUND OF THE INVENTION

The present invention relates to an electronic circuit for a timepiece using a junction type electric field effect transistor (referred to JFET) which controls a potential barrier against a charge carrier which transits from a source to a drain with a forward voltage toward the gate, and more particularly to a gate construction of an oscillating circuit portion and a frequency dividing circuit portion.

Since an integrated circuit of JFET type recently proposed has a possibility to make a delay-power product thereof smaller than that of an IIL construction, attention is paid to this integrated circuit for the sake of saving timepiece power consumption.

DETAILED DESCRIPTION OF THE INVENTION

Figure 1:
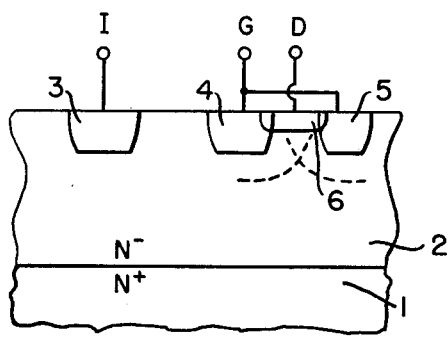
FIG. 1 shows a sectional view of a gate of a junction type electric field effect transistor.
Figure 2:
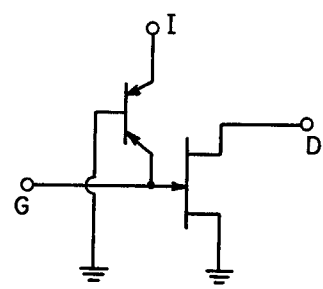
FIG. 2 is an equivalent circuit of FIG. 1.

FIG. 1 shows a sectional view of a JFET and FIG. 2 is an equivalent circuit thereof. In FIG. 1, numeral 1 is a JFET source region of N-conductivity type having a high impurity concentration, numeral 2 is a low impurity concentration region of N conductivity type formed on source region 1 by epitaxial growth and it acts as a base region of a PNP bipolar transistor and a channel region of a JFET as shown in FIG. 2. Numerals 3, 4 and 5 are P-conductivity type regions having a high impurity concentration formed by diffusion and the like. Numeral 3 is an emitter region of a PNP transistor. Numeral 4 is a collector region of an PNP transistor and it also acts as gate region of the JFET. Numeral 5 is also a gate region of the JFET. Numeral 6 is a N-conductivity type region having a high impurity concentration. It acts as a drain region of the JFET and is formed by diffusion and the like. The region shown by dotted lines on the channel region 2 are depletion layer spreading out from the gate regions 4 and 5 to the channel region 2.

The operation of the JFET composed as mentioned above is as follows. When an electric potential of a gate electrode G is low, an electric charge flows from an emitter electrode I of a PNP transistor acting as an injector through the JFET gate electrode G to fore stage and the depletion layer spreads out from the junction between the gate regions 4, 5 of the JFET and channel region 2 thereof to the channel region 2, and electrons transitting from the source region 1 to the drain region 6 collides with the high potential barrier and thereby the drain current $I_D$ through the drain electrode D becomes exceedingly small. When the electric potential of the gate electrode G is high, the electric charge is injected from the emitter electrode of the PNP transistor to the gate regions 4 and 5. And then the junction between the gate regions 4 and 5 and the channel region 2 is biased in the forward direction, and depletion layer becomes narrower and the potential barrier against electrons becomes small and thereby the drain current ID becomes large.

Figure 3:
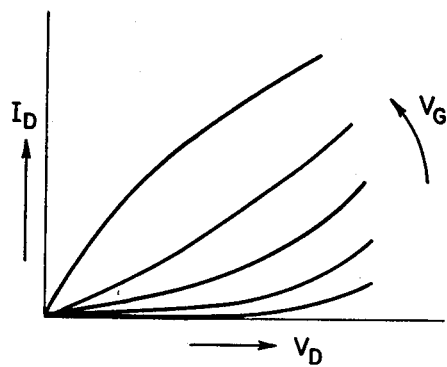
FIG. 3 is a drain voltage drain current characteristic of a junction type electric field effect transistor for a frequency dividing circuit.
Figure 4:
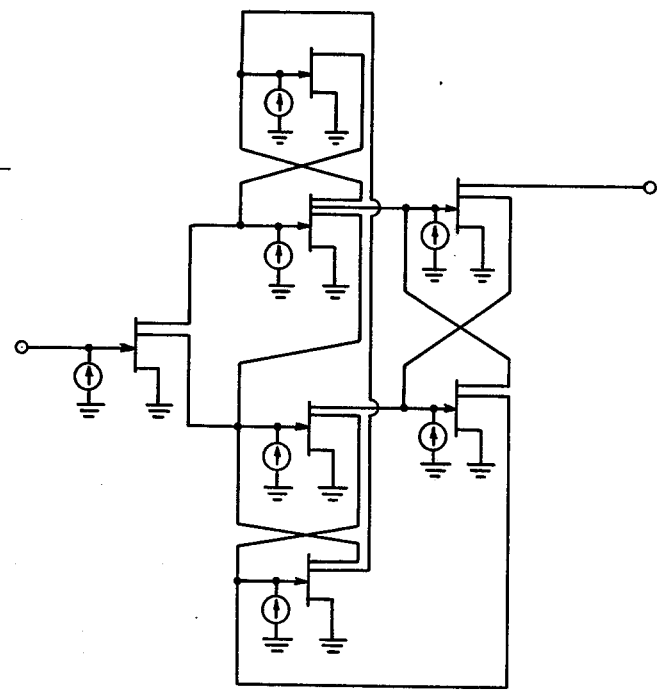
FIG. 4 is an embodiment of a frequency dividing circuit.

The drain voltage $V_D$ drain current $I_D$ characteristic of JFET is shown in FIG. 3 using the gate voltage $V_G$ as a parameter. The equivalent circuit shown in FIG. 4 is an embodiment of the frequency dividing circuit in case the JFET as mentioned above is used in a frequency dividing circuit of an electronic timepiece. In any frequency dividing circuit configuration, since the gate region is expected to be small in order to decrease the gate capacitance, and the high mutual conductance Gm is not required, the space L becomes small.

Figure 5:
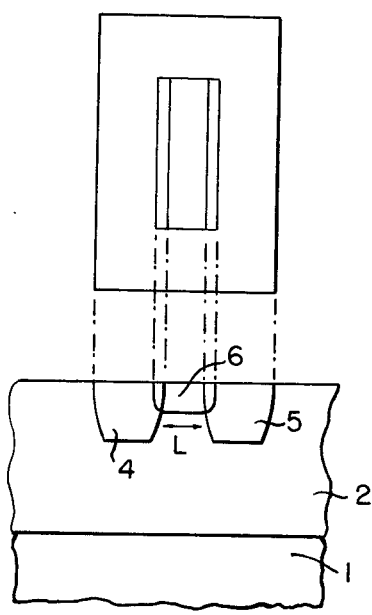
FIG. 5 is a plan view and a sectional view of a junction type electric field effect transistor for a frequency dividing circuit.

FIG. 5 shows a plan view and the corresponding sectional view of the JFET, in which the reference numerals are common to FIG. 1.

Figure 6:
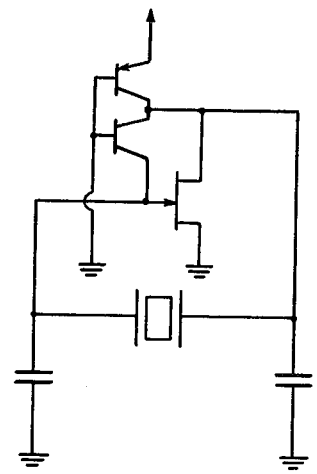
FIG. 6 is an embodiment of an oscillating circuit.
Figure 7:
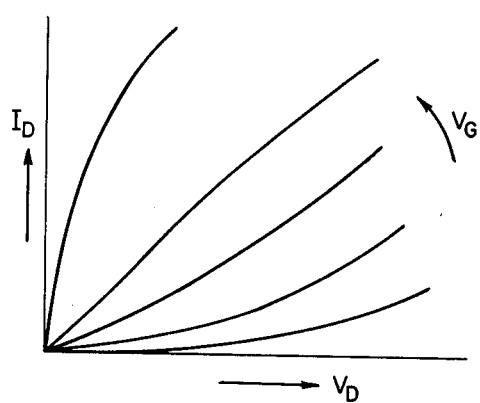
FIG. 7 is a drain voltage-drain current characteristic of a junction type electric field effect transistor for an oscillating circuit.

Now we think about the JFET having the gate space L and used for an oscillating circuit. FIG. 6 is an embodiment of the oscillating circuit including the JFET. The JFET used as an amplifier in the oscillating circuit requires the mutual conductance Gm higher than the JFET used in the frequency dividing circuit. That is to say, the drain voltage drain current characteristic of JFET used in an oscillating circuit must have a high mutual conductance as shown in FIG. 7 in comparison with that of JFET used in the frequency dividing circuit shown in FIG. 3. In this case, if the gate length is extended to obtain the required high mutual conductance Gm, both the gate capacitance and the gate-to-drain capacitance increases. Accordingly the oscillation characteristic is degraded and also, the chip size increases. According the extension of the gate length of JFET is not preferable for the oscillating circuit.

It is an object of the present invention to overcome the above mentioned disadvantages. In the present invention the gate space L of the JFET for the frequency dividing circuit is formed so as to be shorter than that of the gate space of the JFET for the oscillating circuit in order to obtain the drain voltage drain current characteristic having high mutual conductance Gm in the oscillating circuit as shown in FIG. 7, that is, the gate space L' of the JFET for the oscillating circuit is formed so as to be longer than that of the JFET for the frequency dividing circuit.

Figure 8:
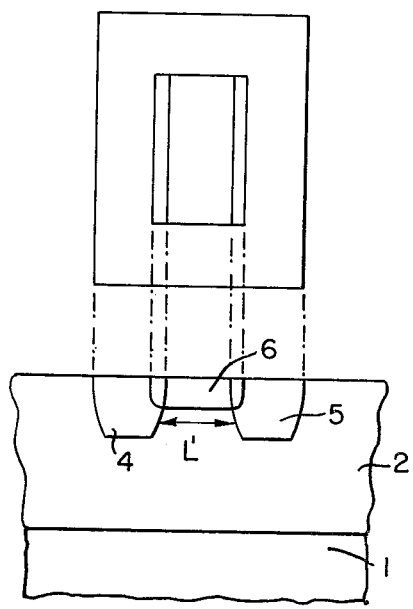
FIG. 8 is a plan view and sectional view of a junction type electric field effect transistor for an oscillating circuit according to the present invention.

The plan view and the sectional view of the JFET for an oscillating circuit according to the present invention is shown in FIG. 8. Numerals in FIG. 8 are common to FIG. 1. The space L' between the gate region 4 and 5 of the JFET for the oscillating circuit is formed so as to be longer than the gate space L of JFET for the frequency dividing circuit shown in FIG. 5. In the above construction, the necessary space for the JFET used in an oscillating circuit becomes small in comparison with the former case which extends the gate length in order to make mutual conductance higher. Accordingly, since the gate-to-drain capacitance which greatly influences the amplifying characteristic as well as the gate capacitance is greatly decreased, and it is advantageous with respect to the characteristic of the oscillating circuit.

As illustrated, in the JFET integrated circuit for a timepiece, since the range of the load capacitance of the oscillating circuit is increased, the oscillation characteristic is greatly improved. Furthermore since the power consumption of the frequency dividing circuit is also reduced at the same time, the design of the integrated circuit becomes easier.

I claim:

1. An electronic circuit for a timepiece, comprising:
   a high impurity concentration semiconductor substrate, and a low impurity concentration expitaxially grown semiconductor layer on said substrate;
   high frequency oscillator circuit means for generating a high frequency oscillating output signal, comprising a vertical junction field effect transistor formed in said low impurity concentration epitaxially grown semiconductor layer, a pair of lateral transistors formed in said low impurity concentration epitaxially grown semiconductor layer and connected for biasing said vertical junction field effect transistor, a quartz crystal vibrator connected to said vertical junction field effect transistor for being driven to oscillate, and a pair of frequency adjusting capacitors connected to said quartz crystal vibrator; and
   frequency dividing circuit means for dividing the oscillating output signal from said oscillator circuit means for developing a low frequency timing signal, said dividing circuit means comprising at least one divider stage including a vertical junction field effect transistor formed in said low impurity concentration epitaxially grown semiconductor layer, the vertical junction field effect transistor of said oscillator circuit means having a gate space longer than the gate space of the vertical junction field effect transistor of the divider stage of said dividing circuit means for imparting a higher mutual conductance to said vertical junction field effect transistor comprising said oscillator circuit means than the mutual conductance of said vertical junction field effect transistor comprising the divider stage of said dividing circuit means.

2. An electronic circuit for a timepiece according to claim 1, wherein said semiconductor substrate comprises source regions for said vertical junction field effect transistors.

* * * * *